United States Patent [19]

Gröger et al.

[11] Patent Number: 5,119,312

[45] Date of Patent: Jun. 2, 1992

[54] CIRCUITRY FOR SURVEILLANCE OF SWITCHING STATE OF A POWER TRANSISTOR

[75] Inventors: Jens Gröger, Hanover; Karl-Heinz Hesse, Gehrden; Wolfgang Gudat, Seelze; Gerhard Ruhnau, Neustadt, all of Fed. Rep. of Germany

[73] Assignee: WABCO Westinghouse Fahrzeugbremsen GmbH, Hanover, Fed. Rep. of Germany

[21] Appl. No.: 570,610

[22] Filed: Aug. 21, 1990

[30] Foreign Application Priority Data

Aug. 22, 1989 [DE] Fed. Rep. of Germany ....... 3927647

[51] Int. Cl.⁵ .................. G06F 15/20; G06F 15/46
[52] U.S. Cl. .................. 364/483; 361/93; 361/101; 364/551.01
[58] Field of Search ........... 361/86, 88, 89, 93, 361/97, 98, 101; 364/483, 492; 307/52, 59, 60, 62

[56] References Cited

U.S. PATENT DOCUMENTS

| | | | |
|---|---|---|---|
| 4,174,496 | 11/1979 | McFall et al. | 361/97 |
| 4,441,136 | 4/1984 | Hampshire | 361/88 |
| 4,525,765 | 6/1985 | Brajder | 361/98 |
| 4,558,389 | 12/1985 | Black, Jr. et al. | 361/88 |
| 4,626,954 | 12/1986 | Damiano et al. | 361/97 |
| 4,628,397 | 12/1986 | Gareis et al. | 361/101 |
| 4,641,231 | 2/1987 | Walker et al. | 361/88 |
| 4,651,252 | 3/1987 | Babinski | 361/101 |
| 4,661,880 | 4/1987 | Futsuhara | 361/101 |
| 4,680,664 | 7/1987 | Leuthen | 361/101 |
| 4,682,120 | 7/1987 | Palara et al. | 361/101 |
| 4,945,445 | 7/1990 | Schmerda et al. | 361/101 |

Primary Examiner—Kevin J. Teska
Attorney, Agent, or Firm—Horst M. Kasper

[57] ABSTRACT

A circuit for the surveillance of the switching state of a power transistor is constructed such that both, the voltage applied to the power transistor (1) is surveyed by way of a voltage comparator (7), as well as the voltage applied to the load (3) is surveyed by way of a further voltage comparator (8). The comparator (7) in the switched-on state and the comparator (8) in the switched-off state are activated by the input signal ($U_{IN}$) of the power transistor (1). The output signals of the two comparators (7, 8) are combined to a status signal ($U_{Stat}$). It is possible by way of the proposed circuit to recognize both a short circuit or, respectively, a shunt circuit of the load as well as a leakage current of the power transistor (1) and thus an interruption of the load occurs.

32 Claims, 3 Drawing Sheets

CIRCUITRY FOR SURVEILLANCE OF SWITCHING STATE OF A POWER TRANSISTOR

BACKGROUND OF THE INVENTION

1. Field of the Invention

The invention relates to a circuit for the surveillance of the switching state of a power transistor, in particular for energizing a brake system.

2. Brief Description of the Background of the Invention Including Prior Art

So-called "intelligent" power transistors have become known in recent years which are able to protect themselves by way of integrated sensors and integrated electronic circuits against short circuits, over-voltages, and excess temperature, cf. Journal Siemens Components 25, (1987) Issue 5.

These transistors comprise additionally a surveillance arrangement integrated into the casing. The surveillance arrangement switches the transistor off in case of the presence of impermissible operating conditions. Based on this, the power transistor is protected against destruction.

It is further possible to inform a supervising microcomputer if a short circuit or an interruption of the load is present.

However, an incomplete short circuit or, respectively, a so-called shunt circuit, is not being recognized, i.e. cases where the resistance is too small compared with to the load resistance of the load device controlled. This occurs, for example, in such cases where a load is connected with a real short circuit via a long connection line. Such an error generates an excessive current, which results after some time in over-heating of the transistor and/or of the load.

In addition to the load, the final power transistor for energizing the load can also be defective. This is the case if the final power transistor is switched to a controlled blocked state, but nevertheless allows the passage of an excessive so-called leakage current. It is imperative that this error also be indicated if the leakage current reaches and surpasses impermissibly high values in order to allow to timely undertake appropriate countermeasures.

SUMMARY OF THE INVENTION

1. Purposes of the Invention

It is an object of the present invention to furnish a circuit which allows to monitor or, respectively, to perform a status surveillance of a power transistor.

It is another object of the invention to provide for a circuit which allows to recognize an open load, a short circuit or, respectively, a shunt circuit of the load as well as an excessive leakage current of the power transistor.

It is a further object of the invention to provide a circuit which increases the safety of truck-braking systems.

These and other objects and advantages of the present invention will become evident from the description which follows.

2. Brief Description of the Invention

The present invention provides for a circuit for the surveillance of the switching status of a power transistor. A power transistor has a first terminal, a second terminal, and a control terminal. A voltage source is connected to the first terminal of the power transistor. A first comparator has a first input connected to the first terminal of the power transistor, a second input terminal connected to the second terminal of the transistor, and has an output. A load output line is connected to the second terminal of the transistor. A second comparator has a first input connected to the second terminal of the power transistor, a second input connected to ground, and has an output. A signal input line is connected to the power transistor. A first AND member has a first input connected to the output of the first comparator and a second input connected to the signal input line. An inverter has its input connected to the signal input line and has an output. A second AND member has a first input connected to the output of the second comparator and a second input connected to the output of the inverter. An OR member has a first input connected to the output of the first comparator stage and its second input connected to the output of the second comparator stage. The surveillance circuit is constructed such that it surveys both the voltage applied to the power transistor as well as the voltage applied to the load for maintaining a predetermined voltage region.

The voltage applied to a load can be surveyed in case of a switched-off state of the power transistor. The voltage applied to the power transistor can be surveyed in case of a switched-on state of the power transistor. The first comparator applied to the power transistor, in the switched-on state of the power transistor, can be activated
by its control signal ($U_{IN}$ = high) of the power transistor. The second comparator can be connected and applied to the load and can be activated via the control signal ($U_{IN}$ = low).

A surveillance method for a switching status of a power transistor comprises the following steps. An input voltage is fed via a second terminal to a power transistor. Said transistor has a first terminal, a second terminal, and a control terminal. A power voltage is fed which is derived from a voltage source connected to the first terminal of the power transistor. The power voltage is fed to a first comparator having a first input connected to the first terminal of the power transistor and having a second input terminal connected to feeding electrical output power from the second terminal of the transistor. Said transistor has an output. Power is fed to a load via a load output line connected to the second terminal of the transistor. The signal level of the second terminal of the power transistor is compared to ground level voltage. The second comparator has a first input connected to the second terminal of the power transistor, a second input connected to ground, and has an output. An input signal and a signal from the output of the first comparator are added in a first AND member. Said first AND member has a first input connected to the output of the first comparator and has a second input connected to the signal input line. The input signal is inverted in an inverter having its input connected to the signal input line and having an output. An output signal from the second comparator and an input signal are added in a second AND member. The second ADD member has a first input connected to the output of the second comparator and has a second input connected to the output of the inverter. The outputs of the first AND member and of the second ADD member are subtracted in an OR member. Said OR member has a first input connected to the output of the first comparator stage and has its second input connected to the output of the second comparator stage for surveying both the voltage applied to the power transistor as well as the voltage applied to the load for maintaining a predetermined voltage region.

A voltage can be applied to a device. The applied power can be surveyed in case of a switched-off state of the power transistor. The voltage applied to the power transistor can be surveyed in case of a switched-on state of the power transistor.

The first comparator can be activated via its control signal ($U_{IN}$=high) delivered by the power transistor while the power transistor is in the switched-on state. The second comparator connected and applied to the load can be activated via the control signal ($U_{IN}$=low).

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention.

DESCRIPTION OF INVENTION AND PREFERRED EMBODIMENT

Figure 1:
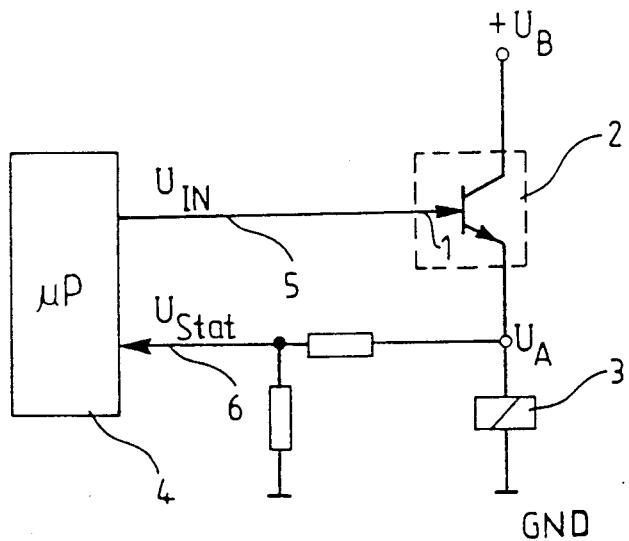
FIG. 1 is a schematic circuit diagram for recognizing the status of a power circuit according to the state of the art.

In accordance with the invention, there is provided a circuit for the surveillance of the switching status of a power transistor. The surveillance circuit is constructed such that it surveys both the voltage applied to the power transistor 1 as well as the voltage applied to the load 3 for maintaining a predetermined voltage region.

The surveillance can be performed via voltage comparators 7, 8. The voltage applied to the load 3 can be surveyed in case of a switched-off state of the power transistor 1. The voltage applied to the power transistor 1 can be surveyed in case of a switched-on state of the power transistor 1. The comparator 7 applied to the power transistor 1, in the switched-on state of the power transistor 1, can be activated by its control signal $U_{IN}$=high of the transistor 1. The comparator 8, connected and applied to the load 3, can be activated via the control signal $U_{IN}$=low of the power transistor 1, while the power transistor 1 is in a switched-off state. The activation can be performed by AND members 10, 11 connected at an output side. The AND member 10 can be switched on directly by the control input signal $U_{IN}$. The AND member 11 can be switched on via an inverter g. The output signals of the AND members 10, 11 can be combined via an OR member 12 for delivery of a status signal $U_{Stat}$.

In FIG. 1 there is shown schematically a conventional circuit for recognizing the status of a final power transistor 1 as well as of a load 3. The load 3, which in the instant case is a coil of a solenoid valve, is supplied by a voltage of a battery $+U_B$ via a final power transistor 1. The final power transistor 1 is part of an amplifier circuit 2, which amplifier circuit 2 contains additional electronic elements, not illustrated in detail. The amplifier circuit 2 is controlled by a microprocessor 4 via an electric line 5 with an input signal $U_{IN}$ and connected to a base of the transistor 1. The state of the transistor 1 as well as of the load 3 is scanned at the connection point $U_A$ and is fed via an electric line 6 as a status signal $U_{Stat}$ to the microprocessor 4.

The microprocessor 4 connects the control signal $U_{IN}$ with the status signal $U_{Stat}$ and recognizes therefrom the state of the final power transistor 1 and of the load 3. The status input of the microprocessor 4 can evaluate high or low signals, where a low signal can be, for example, a signal lower than 2 volts, and a high signal can be, for example, a signal in excess of 4 volts.

The battery voltage $+U_B$ amounts to, for example, 12 volts. The resistance of the final power transistor 1 in a conducting state amounts to, for example, 0.25 ohm. The resistance of the load 3 amounts to, for example, 15 ohms.

If the voltage $U_A$ generates a status voltage $U_{Stat}$ of more than 4 volts in the conducting state, then the microprocessor 4 recognizes that the load 3 is appropriate. If, however, a signal $U_{Stat}$ of less than 2 volts is generated, then the microprocessor 4 recognizes that a short circuit of the load is present.

If in the switched-off state of the transistor 1, the status signal $U_{Stat}$ has a high value, then the microprocessor 4 recognizes an interruption of the load 3, which state is called "open load," or a leakage current of the transistor, if this leakage current surpasses a certain value.

The disadvantage or shortcoming of the conventional circuit according to FIG. 1 includes that a so-called shunt connection of the load 3 in a value of, for example, 0.6 ohm is not recognized by the circuit, because based on the high current, delivered by the battery, the status voltage $U_{Stat}$ remains on the high level. An appropriate load 3 is indicated to the microprocessor 4 even though this load 3 draws too high a current.

In addition, a leakage current of the transistor 1 in a blocked state is not clearly recognized.

Figure 2:
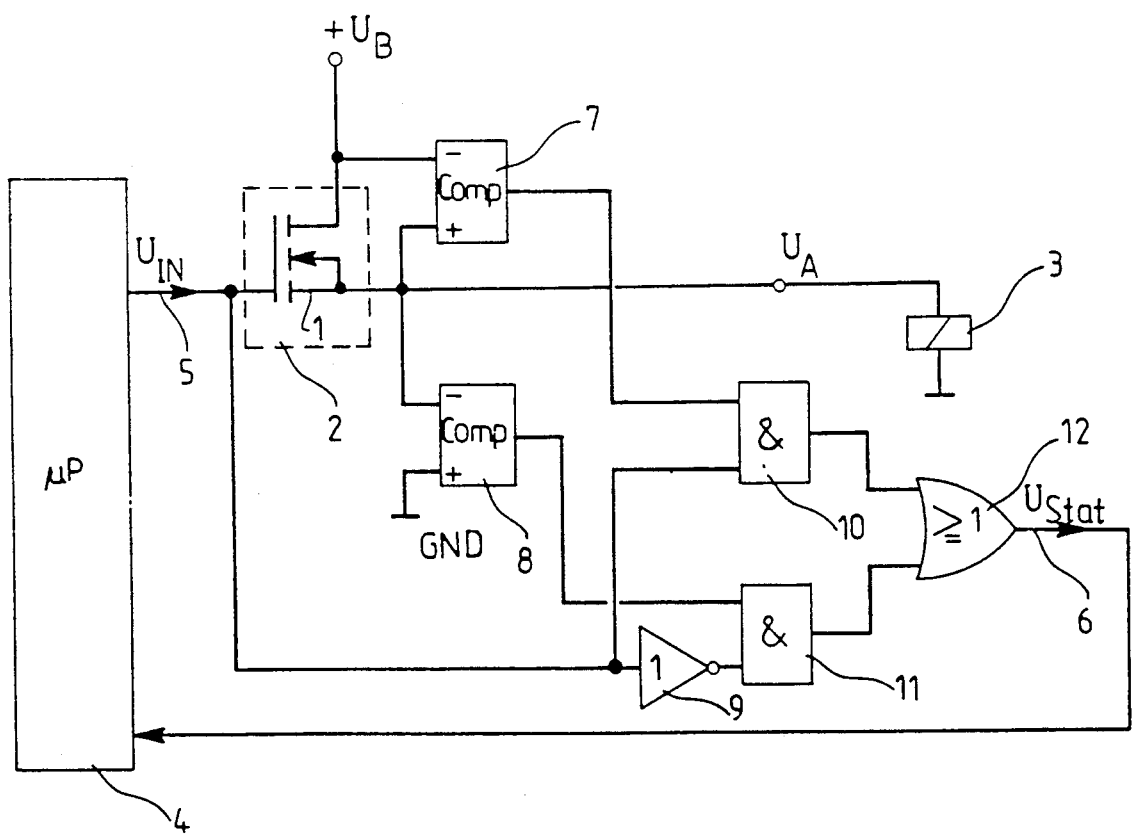
FIG. 2 is a schematic circuit diagram for recognizing the status of a power circuit according to the instant invention.

These disadvantages are eliminated by the invention circuit according to FIG. 2. The invention circuit comprises again a power transistor 1 which is supplied by a battery voltage $+U_B$ and which controls a load 3. The input signal $U_{IN}$ is supplied via the line 5 to the base of the transistor 1. The status signal $U_{Stat}$ is coupled out and delivered to a control circuit via the line 6. The lines 5 and 6 of FIG. 2 can be connected to a microprocessor 15.

The voltage $U_A$ is evaluated via a terminal of the load 3. For this purpose, a comparator 8 is employed which delivers a low signal in case of an input voltage of less than, for example, 2 volts, and which delivers a high signal in case of an input voltage of more than, for example, 2 volts.

In addition to the circuit arrangement illustrated in FIG. 1, there is also scanned the voltage at the power transistor 1 by way of a further comparator 7. If the voltage is smaller than, for example, 2 volts in the conducting state of the transistor 1, then the comparator 7 delivers a high signal. In case of a voltage drop via the transistor 1 of more than 2 volts, the comparator 7 delivers a low signal. As can be recognized, the output signal of the comparator 7 is inverted. This is the result of that the comparator 7 is connected with its plus input to the voltage $U_4$, but in contrast the comparator 8 is connected with its minus input to the voltage $U_4$.

It can be noted for a stable operating voltage $U_B$ of 12 volts that the potential of $U_4$ is smaller or larger than 10 volts in the case of a conduction transistor and the voltage $U_{IN}$=high or if the potential of $U_4$ is larger or smaller than 2 volts in case of a blocked transistor and $U_{IN}$=low.

The outputs of the two comparators 7 and 8 are each fed to a respective AND member 10 and 11, respectively. The second input connection of the AND member 10 is connected to the line 5, i.e. to the control signal $U_{IN}$ of the transistor 1. The second input connection of the AND member 11 is also connected to the electric line 5 via an inverter 9.

The outputs of the AND members 10 and 11 are combined via an OR member 12, where the status output line 6 carries the status signal $U_{Stat}$.

The invention circuit according to FIG. 2 operates as follows.

The state of the switched-on power transistor $U_{IN}=$ high is investigated with the comparator 7, disposed at a voltage level above the power transistor 1. If the voltage drop $U_B - U_4$ between battery and power output at the transistor is smaller than 2 volts, then the comparator 7 delivers a high signal. This high signal is passed on via the now switched-on AND member 10 as well as the OR member 12 to the status output line 6.

The microprocessor 15 thereby recognizes that the load 3 is appropriate and that the transistor 1 is in a conducting state.

If, however, the output signal of the comparator 7 is low, i.e. a too large voltage drop occurs at the transistor 1, then the supervising microprocessor recognizes that an overload state or a short circuit of the load 3 has to be present and that the transistor 1 is not completely conducting.

The further comparator 8 serves for distinguishing. The voltage applied to the load 3 is then tested with this further comparator 8, if the input signal $U_{IN}$ of the transistor 1 exhibits a low level, i.e. the transistor 1 is blocked. If in this state the voltage $U_4$ has a value of less or equal to 2 volts, then the supervising microprocessor recognizes that the load 3 is appropriate and that the transistor 1 is blocked. In this case, the comparator 8 delivers a low signal, which is delivered as a status signal $U_{Stat}$ via the now switched-on AND member 11 as well as via the OR member 12.

If the voltage $U_4$ is larger or equal to 2 volts, then the comparator 8 delivers a high signal, which again is delivered as a status signal $U_{Stat}$ via the electric line 6. In this case, the microprocessor determines a short circuit of the transistor 1 or a leakage current of the transistor 1 which is too large, or an interruption or "open load" of the load 3.

The mode of operation is illustrated in the following by way of a table providing additional clarity. This table illustrates how an error of a transistor leakage current, that is a current while the transistor should really be blocking, is not being recognized with the circuit according to conventional technology and how this leakage current is being recognized with the present invention circuit.

Be it assumed that the threshold for the voltage $U_{STAT}$ be equal to 6 volts in a circuit according to the state of the art (FIG. 1), i.e.

$U_{STAT} > 6$ V : High (H), otherwise low (L).

There results in the case of no interference:

| $U_{IN}$ | $U_{STAT}$ | $U_4$ |
|---|---|---|
| L | L | 0 V |
| H | H | 11 V |

There results in the case of a presence of a leakage current:

| $U_{IN}$ | $U_{STAT}$ | $U_4$ |
|---|---|---|
| L | L | 5 V |
| H | H | 11 V |

As can be recognized immediately the pair of values $U_{STAT}$ is the same in both cases. The microprocessor is therefore not capable of recognizing the leakage current error.

The following table results for the same error based on the invention circuit (FIG. 2).

The threshold for the voltage $U_4$ is in this case equal 10 volts in a conducting state determined by comparator 7 and 2 V in a blocked state of the transistor 1 determined by comparator 8. First the unperturbed situation:

| $U_{IN}$ | $U_{STAT}$ | $U_4$ |
|---|---|---|
| L | L | 0 V |
| H | H | 11 V |

Now there results for the perturbed situation:

| $U_{IN}$ | $U_{STAT}$ | $U_4$ |
|---|---|---|
| L | H | 5 V |
| H | H | 11 V |

The presence of an erroneous state (underlined) is here recognized by the microprocessor, which recognizes the presence of a leakage current error.

The essential advantage of the invention circuit according to FIG. 2 comprises that it recognizes, in case of a switched-on state of the transistor 1, an error of the so-called shunt circuit relative to the load, which is generally not easily detected. In case of a switched-off state of the transistor 1, excessive leakage currents of the transistor 1 can be uncovered.

Thus, it can be recognized whether the load is in fact in a switched-on or, respectively, switched-off state depending on a control input.

The entire circuit according to FIG. 2 can advantageously be integrated within the casing of the power transistor 1.

The circuit according to the invention, of course, can also be formed in ways other than illustrated in FIG. 2 by way of example without leaving the scope of the invention.

Figure 3:
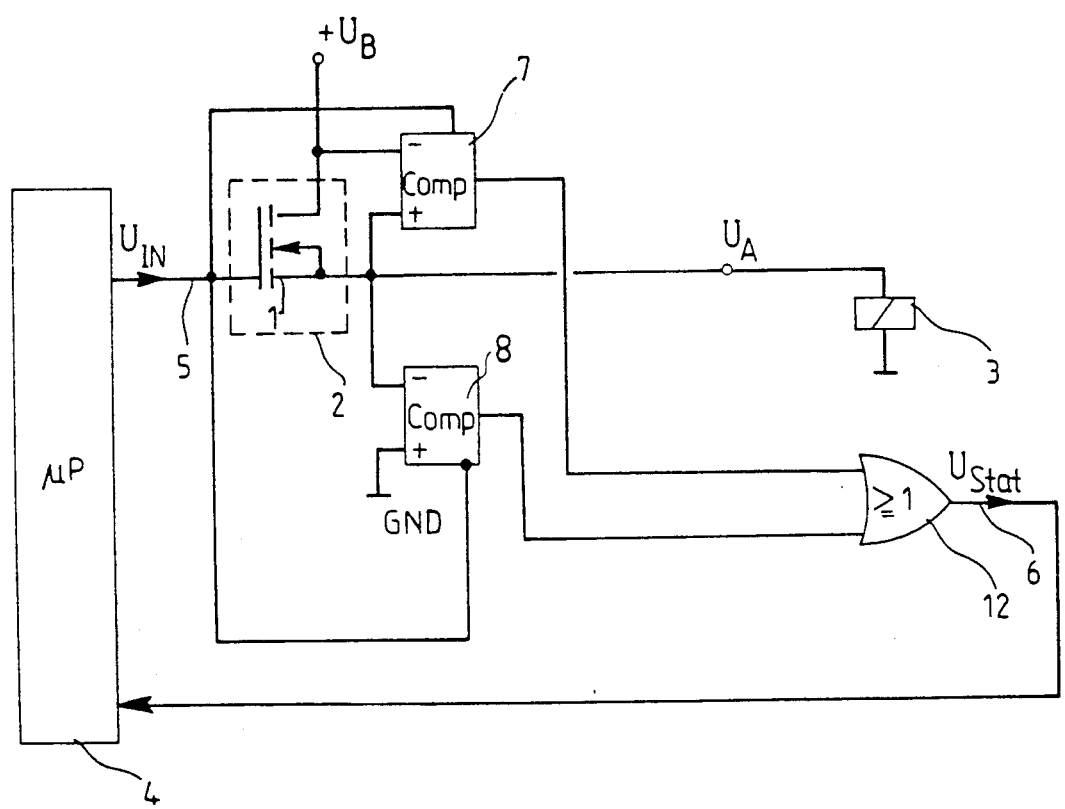
FIG. 3 is a schematic circuit diagram of a further embodiment for recognizing the status of a power circuit according to the instant invention

For example, the AND members 10, 11 can be substituted by a particular input of the comparators 7, 8, where the input signal $U_{IN}$ can activate this particular input of the comparators 7, 8 (FIG. 3).

Figure 4:
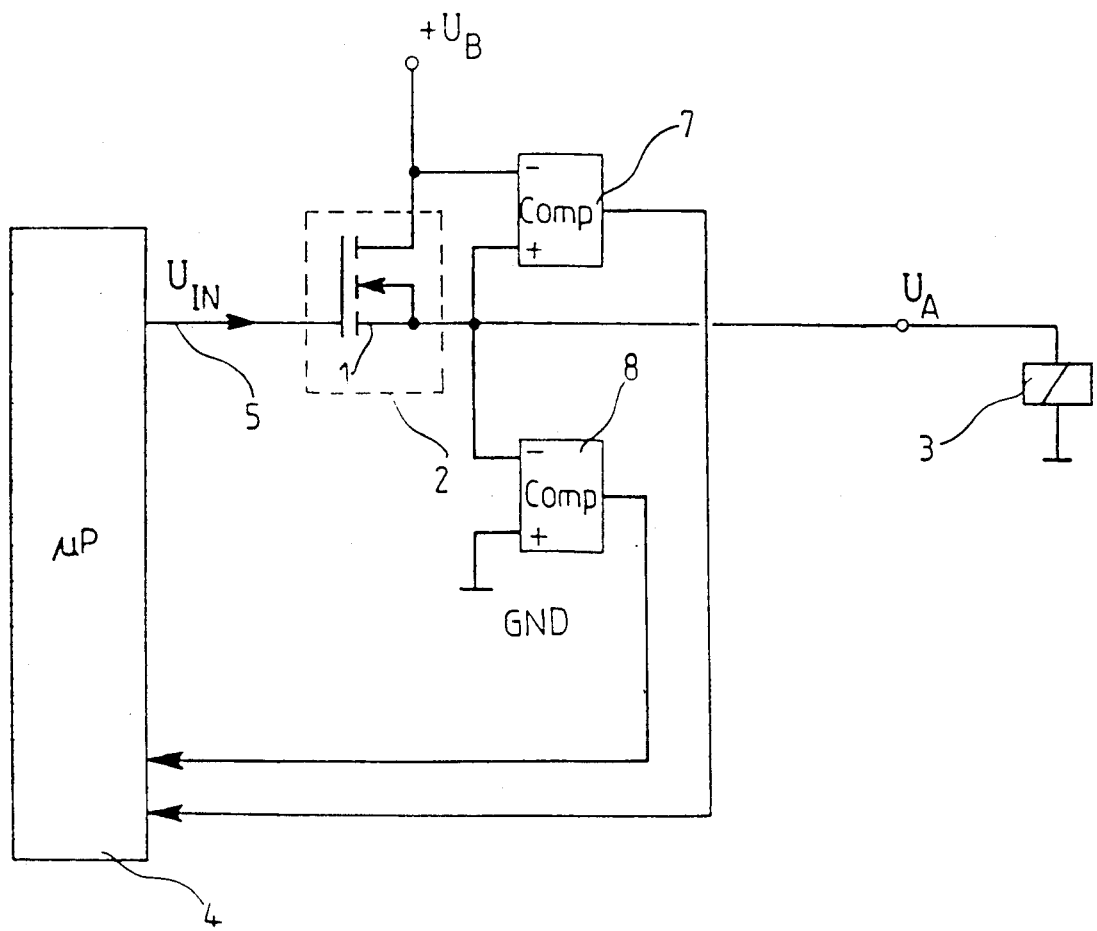
FIG. 4 is a schematic circuit diagram of yet another embodiment for recognizing the status of a power circuit according to the instant invention.

In addition, the outputs of the comparators 7, 8 can also be directly connected to the microprocessor 15 and can be evaluated correspondingly by the microprocessor 15 (FIG. 4).

It will be understood that each of the elements described above, or two or more together, may also find a useful application in other types of circuits from the types described above.

While the invention has been illustrated and described as embodied in the context of a circuitry for surveillance of the switching state of a power transistor, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A circuit for surveillance of a switching status of a power transistor, wherein the power transistor is switched by a microprocessor, wherein
   a surveillance circuit is constructed such and is controlled by the microprocessor (4) such that the surveillance circuit surveys sequentially both a voltage applied to the power transistor (1) as well as the voltage applied to a load (3) for maintaining a reference voltage region and wherein the surveillance circuit returns surveillance results to the microprocessor (4);
   wherein the surveillance is performed via two voltages comparators (7, 8);
   wherein the voltage applied to the load (3) is surveyed in case of a switched-off state of the power transistor (1), and wherein the voltage applied to the power transistor (1) is surveyed in case of a switched-on state of the power transistor (1).

2. The circuit according to claim 1, wherein an activation of the comparators (7, 8) is performed via separate inputs with a control signal ($U_{IN}$) of the power transistor (1).

3. The circuit according to claim 1, wherein the outputs of the comparators (7, 8) are connected directly to the microprocessor (4).

4. The circuit according to claim 1, wherein the voltage comparator (7), connected and applied to the power transistor (1), is activated by a control signal ($U_{IN}$=high) of the power transistor (1) while the power transistor (1) is in a switched-on state, and wherein the voltage comparator (8), connected and applied to the load (3), is activated via a control signal ($U_{IN}$=low) of the power transistor (1), while the power transistor (1) is in a switched-off state.

5. The circuit according to claim 4, wherein the voltage comparators (7, 8) are actuated by AND members (10, 11), wherein the AND members (10, 11) are connected at an output side of the voltage comparators (7, 8), and wherein the AND member (10) is switched on directly by the control input signal ($U_{IN}$), and wherein the AND member (11) is switched on via an inverter (9).

6. The circuit according to claim 5, wherein the output signals of the AND members (10, 11) are combined via an OR member (12) for delivery of a status signal ($U_{Stat}$), wherein the status signal ($U_{Stat}$) resulting from the surveillance, is fed to the microprocessor (4).

7. A circuit for surveillance of a switching status of a power transistor comprising
   a power transistor having a first terminal, a second terminal, and a control terminal;
   a voltage source connected to the first terminal of the power transistor;
   a first comparator having a first input connected to the first terminal of the power transistor and having a second input terminal connected to the second terminal of the transistor and having an output;
   a load output line connected to the second terminal of the transistor;
   a second comparator having a first input connected to the second terminal of the power transistor and having a second input connected to ground and having an output;
   a signal input line connected to a third terminal of the power transistor;
   a microcomputer connected to the signal input line;
   a first AND member having a first input connected to the output of the first comparator and having a second input connected to the signal input line;
   an inverter having its input connected to the signal input line and having an output;
   a second AND member having a first input connected to the output of the second comparator and having a second input connected to the output of the inverter; and
   an OR member having a first input connected to the output of a first comparator stage and having its second input connected to the output of a second comparator stage, wherein the surveillance circuit is constructed such that it surveys both the voltage applied to the power transistor as well as the voltage applied to the load output line for maintaining a reference voltage region.

8. The circuit according to claim 7, wherein the OR member has an output connected to the microprocessor.

9. The circuit according to claim 7, wherein the voltage applied to a load is surveyed in case of a switched-off stage of the power transistor, and wherein the voltage applied to the power transistor is surveyed in case of a switched-on state of the power transistor.

10. The circuit according to claim 7, wherein the first comparator, connected and applied to the power transistor, is activated by a control signal ($U_{IN}$=high) of the power transistor while the power transistor is in a switched-on state, and wherein the second comparator is connected and applied to the load and is activated via a control signal ($U_{IN}$=low).

11. The circuit according to claim 7, wherein an activation of the first comparator and of the second comparator is performed via separate inputs of the first comparator and of the second comparator with a control signal ($U_{IN}$) furnished by the power transistor.

12. The circuit according to claim 7, wherein the output of the first comparator is connected directly to the microprocessor and wherein the output of the second comparator is connected directly to the microprocessor.

13. A surveillance method for a switching status of a power transistor comprising
feeding an input voltage via a second terminal to a power transistor, said transistor having a first terminal, a second terminal, and a control terminal;
feeding a power voltage derived from a voltage source connected to the first terminal of the power transistor;
feeding the power voltage to a first comparator having a first input connected to the first terminal of the power transistor and having a second input terminal connected to feeding electrical output power from the second terminal of the transistor, wherein said transistor has an output;
feeding power to a load via a load output line connected to the second terminal of the transistor;
comparing the signal level of the second terminal of the power transistor to ground level voltage, wherein the second comparator has a first input connected to the second terminal of the power transistor, a second input connected to ground, and has an output;
adding an input signal and a signal from the output of the first comparator in a first AND member, said first AND member having a first input connected to the output of the first comparator and having a second input connected to the signal input line;
inverting the input signal in an inverter having its input connected to the signal input line and having an output; adding an output signal from the second comparator and an input signal in a second AND member, wherein the second AND member has a first input connected to the output of the second comparator and has a second input connected to the output of the inverter; and
subtracting the output of the first AND member and of the second AND member in an OR member, said OR member having a first input connected to the output of the first comparator stage and having its second input connected to the output of the second comparator stage for surveying both the voltage applied to the power transistor as well as the voltage applied to the load for maintaining a predetermined voltage region.

14. The surveillance method according to claim 13 further comprising
surveying the applied power in case of a switched-off state of the power transistor; and
surveying the power applied to the power transistor in case of a switched-on state of the power transistor.

15. The surveillance method according to claim 13 further comprising
activating the first comparator via its control signal ($U_{IN}$=high) delivered by the power transistor while the power transistor is in the switched-on state; and
activating the second comparator connected and applied to the load via the control signal ($U_{IN}$=-low).

16. The surveillance method according to claim 13 further comprising
deriving the input voltage for the power transistor from a microprocessor.

17. The surveillance method according to claim 13 further comprising
feeding the output voltage of the OR member via an output terminal of the OR member to a microprocessor.

18. The surveillance method according to claim 13 further comprising
feeding the output voltage of the first comparator directly to a microprocessor and feeding the output voltage of the second comparator directly to the microprocessor.

19. A circuit for the surveillance of the switching status of a power transistor comprising
a power transistor having a first terminal, a second terminal, and a control terminal;
a voltage source connected to the first terminal of the power transistor;
a first comparator having a first input connected to the first terminal of the power transistor and having a second input terminal connected to the second terminal of the transistor and having an output;
a load output line connected to the second terminal of the transistor;
a second comparator having a first input connected to the second terminal of the power transistor and having a second input connected to ground and having an output;
a signal input line connected to the third terminal of the power transistor;
a microcomputer connected to the signal line;
a first AND member having a first input connected to the output of the first comparator and having a second input connected to the signal input line;
an inverter having its input connected to the signal input line and having an output;
a second AND member having a first input connected to the output of the second comparator and having a second input connected to the output of the inverter; and
an OR member having a first input connected to the output of the first comparator stage and having its second input connected to the output of the second comparator stage, wherein the surveillance circuit is constructed such that it surveys both the voltage applied to the power transistor as well as the voltage applied to the load for maintaining a predetermined voltage region, wherein the voltage applied to a load is surveyed in case of a switched-off state of the power transistor, and wherein the voltage applied to the power transistor is surveyed in case of a switched-on state of the power transistor.

20. A surveillance system for monitoring a switching status of a power transistor, comprising
a power transistor addressed by a microprocessor;
a surveillance circuit constructed such and controlled by the microprocessor (4) such that the surveillance circuit surveys sequentially both a voltage applied to the power transistor (1) as well as a voltage applied to a load (3) for maintaining a reference voltage region, wherein the surveillance circuit returns surveillance results to the microprocessor (4); and
two voltage comparators (7, 8) for performing the surveillance;
wherein the voltage applied to the load (3) is surveyed in case of a switched-off state of the power transistor (1), and wherein the voltage applied to the power transistor (1) is surveyed in case of a switched-on state of the power transistor (1).

21. A surveillance system for monitoring a switching status of a power transistor comprising
a power transistor having a first terminal, a second terminal, and a control terminal;
a voltage source connected to the first terminal of the power transistor;
a first comparator having a first input connected to the first terminal of the power transistor and having a second input terminal connected to the second terminal of the transistor and having an output;
a load output line connected to the second terminal of the transistor;
a second comparator having a first input connected to the second terminal of the power transistor and having a second input connected to ground and having an output;
a signal input line connected to the third terminal of the power transistor; and
a microcomputer connected to the signal line, wherein the surveillance circuit is constructed such that it surveys both the voltage applied to the power transistor as well as the voltage applied to the load output line for maintaining a reference voltage region.

22. The surveillance system according to claim 21, further comprising
a first AND member having a first input connected to the output of the first comparator and having a second input connected to the signal input line;
an inverter having its input connected to the signal input line and having an output;
a second AND member having a first input connected to the output of the second comparator and having a second input connected to the output of the inverter; and
an OR member having a first input connected to the output of a first comparator stage and having its second input connected to the output of the second comparator stage;
wherein
the OR member has an output connected to the microprocessor.

23. The surveillance system according to claim 21, wherein
the voltage applied to a load is surveyed in cased of a switched-off state of the power transistor, and wherein the voltage applied to the power transistor is surveyed in case of a switched-on state of the power transistor.

24. The surveillance system according to claim 21, wherein
the first comparator, connected and applied to the power transistor, is activated by a control signal ($U_{IN}$=high) of the power transistor while the power transistor is in a switched-on state, and wherein the second comparator is connected and applied to the load and is activated via a control signal ($U_{IN}$=low).

25. The surveillance system according to claim 21, wherein
an activation of the first comparator and of the second comparator is performed via separate inputs of the first comparator and of the second comparator with a control signal ($U_{IN}$) furnished by the microprocessor.

26. The surveillance system according to claim 21, wherein
the output of the first comparator is connected directly to the microprocessor and wherein the output of the second comparator is connected directly to the microprocessor.

27. A surveillance method for a switching status of a power transistor comprising
feeding a control voltage via a control terminal to a power transistor, said transistor having a first terminal, a second terminal, and a control terminal;
feeding a power voltage derived from a voltage source to the first terminal of the power transistor;
feeding the power voltage to a first comparator having a first input connected to the first terminal of the power transistor and having a second input terminal connected to the second terminal of the transistor;
feeding power to a load via a load output line connected to the second terminal of the transistor; and
comparing the signal level of the second terminal of the power transistor to ground level voltage by a second comparator, wherein the second comparator has a first input connected to the second terminal of the power transistor, a second input connected to ground, and has an output.

28. The surveillance method according to claim 23 further comprising
surveying the applied power in case of a switched-off state of the power transistor; and
surveying the power applied to the power transistor in case of a switched-on state of the power transistor.

29. The surveillance method according to claim 23, further comprising
activating the first comparator via its control signal ($U_{IN}$=high) delivered by the power transistor while the power transistor is in the switched-on state; and
activating the second comparator connected and applied to the load via the control signal ($U_{IN}$=low).

30. The surveillance method according to claim 27, wherein
the control voltage for the power transistor from a microprocessor disposed within the control terminal.

31. The surveillance method according to claim 27, further comprising
adding an input signal and a signal from the output of the first comparator in a first AND member, said first AND member having a first input connected to the output of the first comparator and having a second input connected to the signal input line;
inverting the input signal in an inverter having its input connected to the signal input line and having an output;
adding an output signal from the second comparator and an input signal in a second AND member, wherein the second AND member has a first input connected to the output of the second comparator and has a second input connected to the output of the inverter; and
subtracting the output of the first AND member and of the second AND member in an OR member, said OR member having a first input connected to the output of the first comparator stage and having its second input connected to the output of the second comparator stage for surveying both the voltage applied to the power transistor as well as the voltage applied to the load for maintaining a predetermined voltage region.

32. The surveillance method according to claim 31, further comprising feeding the output voltage of the OR member via an output terminal of the OR member to a microprocessor.

* * * * *